US012642128B2

(12) United States Patent
Hasnat et al.

(10) Patent No.: US 12,642,128 B2
(45) Date of Patent: May 26, 2026

(54) THREE-DIMENSIONAL (3D) NAND COMPONENT WITH CONTROL CIRCUITRY ACROSS MULTIPLE WAFERS

(71) Applicant: INTEL NDTM US LLC, Santa Clara, CA (US)

(72) Inventors: Khaled Hasnat, San Jose, CA (US); Prashant Majhi, San Jose, CA (US); Owen Jungroth, Sonora, CA (US); Richard Fastow, Cupertino, CA (US); Krishna K. Parat, Palo Alto, CA (US)

(73) Assignee: INTEL NDTM US LLC, Santa Clara, CA (US)

( * ) Notice: Subject to any disclaimer, the term of this patent is extended or adjusted under 35 U.S.C. 154(b) by 232 days.

(21) Appl. No.: 17/314,979

(22) Filed: May 7, 2021

(65) Prior Publication Data

US 2022/0359441 A1     Nov. 10, 2022

(51) Int. Cl.
| | |
|---|---|
| *H01L 25/065* | (2023.01) |
| *H01L 23/00* | (2006.01) |
| *H01L 25/00* | (2006.01) |
| *H01L 25/18* | (2023.01) |

(52) U.S. Cl.
CPC .............. *H01L 24/08* (2013.01); *H01L 24/80* (2013.01); *H01L 25/0657* (2013.01); *H01L 25/18* (2013.01); *H01L 25/50* (2013.01); *H01L 2224/08145* (2013.01); *H01L 2224/80895* (2013.01); *H01L 2224/80896* (2013.01); *H01L 2924/1431* (2013.01); *H01L 2924/14511* (2013.01)

(58) Field of Classification Search
CPC ..... H01L 24/08; H01L 24/80; H01L 25/0657; H01L 25/18; H01L 25/50; H01L 2224/08145; H01L 2224/80895; H01L 2224/80896; H01L 2924/1431; H01L 2924/14511; H10B 43/27; H10B 43/40; H10B 43/50; H10B 43/00
See application file for complete search history.

(56) References Cited

U.S. PATENT DOCUMENTS

| | | | | |
|---|---|---|---|---|
| 8,947,931 B1* | 2/2015 | D'Abreu | ............. | H01L 25/0652 |
| | | | | 365/185.11 |
| 10,651,153 B2* | 5/2020 | Fastow | ............... | H01L 25/0652 |
| 10,923,450 B2 | 2/2021 | Fastow et al. | | |
| 12,057,421 B2* | 8/2024 | Ahn | ......................... | H01L 25/18 |
| 2013/0103889 A1* | 4/2013 | Jeong | ................... | G06F 12/0246 |
| | | | | 711/E12.008 |
| 2015/0364215 A1* | 12/2015 | Frayer | ..................... | H01L 25/50 |
| | | | | 438/15 |

(Continued)

*Primary Examiner* — William B Partridge
*Assistant Examiner* — Felix B Andrews
(74) *Attorney, Agent, or Firm* — Morgan, Lewis & Bockius LLP

(57) ABSTRACT

Three-dimensional (3D) NAND components formed with control circuitry split across two wafers can provide for more area for control circuitry for an array, enabling improved 3D NAND system performance. In one example, a 3D NAND component includes a first die including a three-dimensional (3D) NAND array and first complementary metal oxide semiconductor (CMOS) control circuitry to access the 3D NAND array, and a second die vertically stacked and bonded with the first die, the second die including second CMOS control circuitry to access the 3D NAND array of the first die.

15 Claims, 11 Drawing Sheets

(56) References Cited

U.S. PATENT DOCUMENTS

| | | | |
|---|---|---|---|
| 2018/0102344 A1* | 4/2018 | Ramachandra | G11C 7/22 |
| 2019/0043836 A1* | 2/2019 | Fastow | H01L 25/0657 |
| 2020/0135719 A1* | 4/2020 | Brewer | G11C 11/005 |
| 2020/0411496 A1* | 12/2020 | Zhang | H01L 25/0657 |
| 2023/0004310 A1* | 1/2023 | Kondo | G06F 12/06 |
| 2023/0124035 A1* | 4/2023 | Li | G06N 5/01 |
| | | | 711/154 |
| 2024/0194547 A1* | 6/2024 | Pan | H01L 23/145 |

* cited by examiner

CMOS
202B

ARRAY
200

CMOS
202A

FORM CMOS CONTROL CIRCUITRY AND A 3D NAND
ARRAY ON A FIRST WAFER
402

FORM CMOS CONTROL CIRCUITRY ON A SECOND
WAFER
404

BOND THE TOP SIDE OF THE FIRST WAFER WITH
THE TOP SIDE OF THE SECOND WAFER
406

FORM A VIA FROM THE BACKSIDE OF THE SECOND
WAFER TO CONNECT TO INTERCONNECTS OF THE
FIRST WAFER
408

501B

TOP SIDE
520A

TOP SIDE
520B

501A

BONDING
INTERFACE
522

BACK SIDE
524B

501B

501A

700

THREE-DIMENSIONAL (3D) NAND COMPONENT WITH CONTROL CIRCUITRY ACROSS MULTIPLE WAFERS

FIELD

The descriptions are generally related to non-volatile storage media such as NAND flash memory, and specifically to 3D NAND memory with control circuitry across multiple wafers.

BACKGROUND

Flash storage, such as NAND flash memory, is a non-volatile storage medium. Nonvolatile storage refers to a storage having a state that is determinate even if power is interrupted to the device. Flash memory can be used as memory (e.g., system memory) or as a storage device. There is a trend for systems across the mobile, client, and enterprise segments to use flash memory for storage (e.g., such as solid state drives (SSDs)). One type of NAND flash memory is three dimensional (3D) NAND flash memory, in which vertical NAND strings make up the storage array. Although the 3D NAND flash arrays can store more bits in a given area than two dimensional (2D) NAND, there is continued interest in denser, faster, and more power efficient data storage.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" or "examples" are to be understood as describing a particular feature, structure, and/or characteristic included in at least one implementation of the invention. Thus, phrases such as "in one embodiment" or "in one example" appearing herein describe various embodiments and implementations of the invention, and do not necessarily all refer to the same embodiment. However, they are also not necessarily mutually exclusive.

FIG. 2A illustrates an example of a 3D NAND component with CMOS circuitry divided between two wafers.

Descriptions of certain details and implementations follow, including a description of the figures, which may depict some or all of the embodiments described below, as well as discussing other potential embodiments or implementations of the inventive concepts presented herein.

DETAILED DESCRIPTION

Three-dimensional (3D) NAND components with control circuitry across multiple wafers are described herein.

3D NAND components include one or more arrays of NAND storage or memory cells and control circuitry to access the storage or memory cells. Typically, control circuitry for accessing 3D flash storage arrays includes CMOS (complementary metal oxide semiconductor) circuitry.

Figures 1A, 1B:
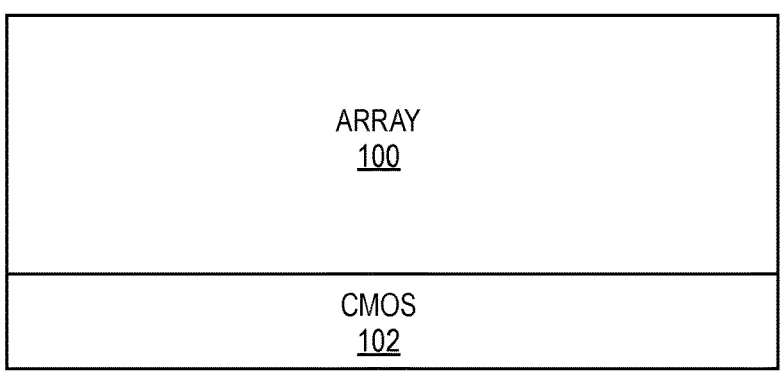
FIG. 1A illustrates an example of a 3D NAND component with CMOS under the array.
FIG. 1B illustrates a top down view of an example of an independent tile group for CMOS circuitry under the array.

In some 3D NAND memory components, the CMOS circuitry to control the array is located under the array ("CuA" or "CMOS under array"). For example, FIG. 1A illustrates an example of a 3D NAND component with CMOS circuitry 102 under the array 100. For 3D NAND components with CMOS under an array, the total area under the array is utilized to place page buffers, wordline drivers, and most of the other periphery circuits. Typically, CuA designs fit the majority of the CMOS circuitry under the array; however, all of the necessary CMOS circuitry typically does not fit under the array, resulting in some CMOS circuitry next to or on the sides of the array. FIG. 1B illustrates a top down view of an example of an independent tile group for CMOS circuitry under the array. In the example in FIG. 1B, there are bitlines 110, wordlines 112, two static page buffer circuits (SPBs) 104A and 104B, two string drivers 106A and 106B, two wordline exits 107A and 107B, and two remaining periphery circuits 108A and 108B. The page buffers in FIG. 1B occupy approximately half of the control circuitry area. The other half of the area is occupied by the string drivers and the remaining peripheral circuitry.

Forming the CMOS under the array enables a relatively small footprint compared to NAND components in which all the CMOS is formed next to or outside of the array. However, placing the CMOS circuitry under the array also limits the area available for control circuitry to the area occupied by the array. As more and more array layers are added to minimize overall 3D NAND cost, it becomes more challenging to fit a sufficient number of page buffers along with wordline drivers and other control circuitry under the array. In order to maintain the same number of page buffers as the number of tiers in 3D NAND technology increases, typically the number of page buffers are reduced for a given density or the total component density is increased. Both of these approaches reduce the total number of pages at a given component density resulting in an overall reduction in NAND system performance.

In contrast, bonding an additional wafer with control circuitry to the wafer with the array can provide for more area for control circuitry for an array, enabling improved 3D NAND system performance. In one example, a lower cost CMOS wafer is combined with a wafer containing both array and CMOS using a wafer-to-wafer bonding process. In one such example, after dicing, a 3D NAND component includes a first die with both a 3D NAND array and first CMOS control circuitry to access the 3D NAND array, and a second die vertically stacked and bonded with the first die, the second die including second CMOS control circuitry to access the 3D NAND array of the first die. Thus, a 3D NAND device with control circuitry both under and over the array may provide a cost-effective way to increase the total number of page buffers, wordline drivers and periphery resulting in an increase NAND system performance.

Figure 2A:
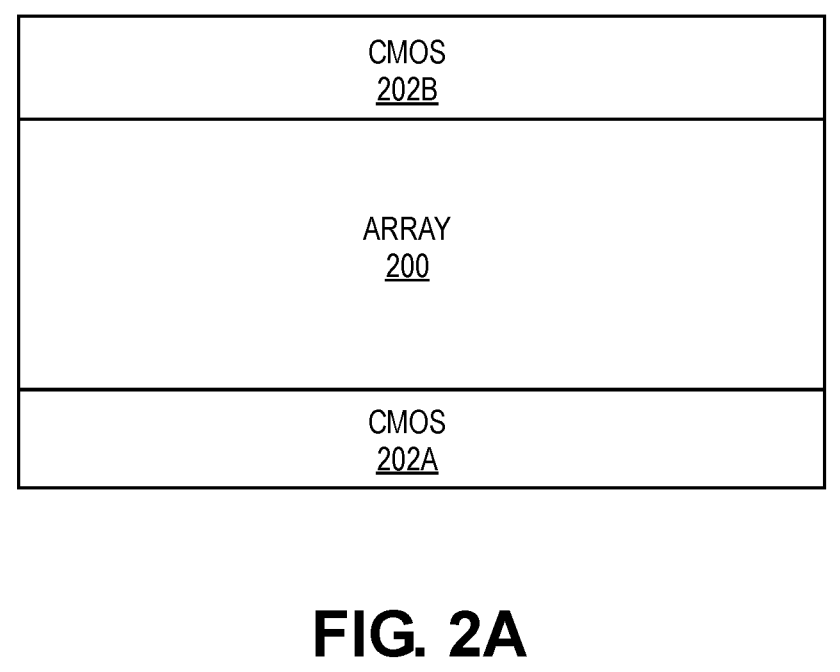

FIG. 2A illustrates an example of a non-volatile storage component with CMOS circuitry divided between two wafers. In one example, the 3D NAND component includes CMOS control circuitry both under and over the array. In one such example, the array 200 and the CMOS circuitry 202A are formed on one wafer, and the CMOS circuitry 202B is formed on a second wafer. In another example, the array 200 and the CMOS circuitry 202B are formed on one wafer, and the CMOS circuitry 202A is formed on a second wafer. The wafers can then be bonded and electrically connected to enable both the control circuitry 202A and 202B to access the array 200.

After bonding, the wafers can be cut or diced to form multiple NAND components that each include two dies (e.g., stacked portions/dies from two bonded wafers). For example, a NAND component may include a first die with a 3D NAND array and first CMOS control circuitry to access the 3D NAND array and a second die vertically stacked and bonded with the first die, the second die including second CMOS control circuitry to access the 3D NAND array of the first die. Regardless of which CMOS circuitry is formed on the same wafer as the 3D NAND array, in the illustrated example, the 3D NAND array is between the first CMOS control circuitry of the first die and the second CMOS control circuitry of the second die.

Figure 2B:
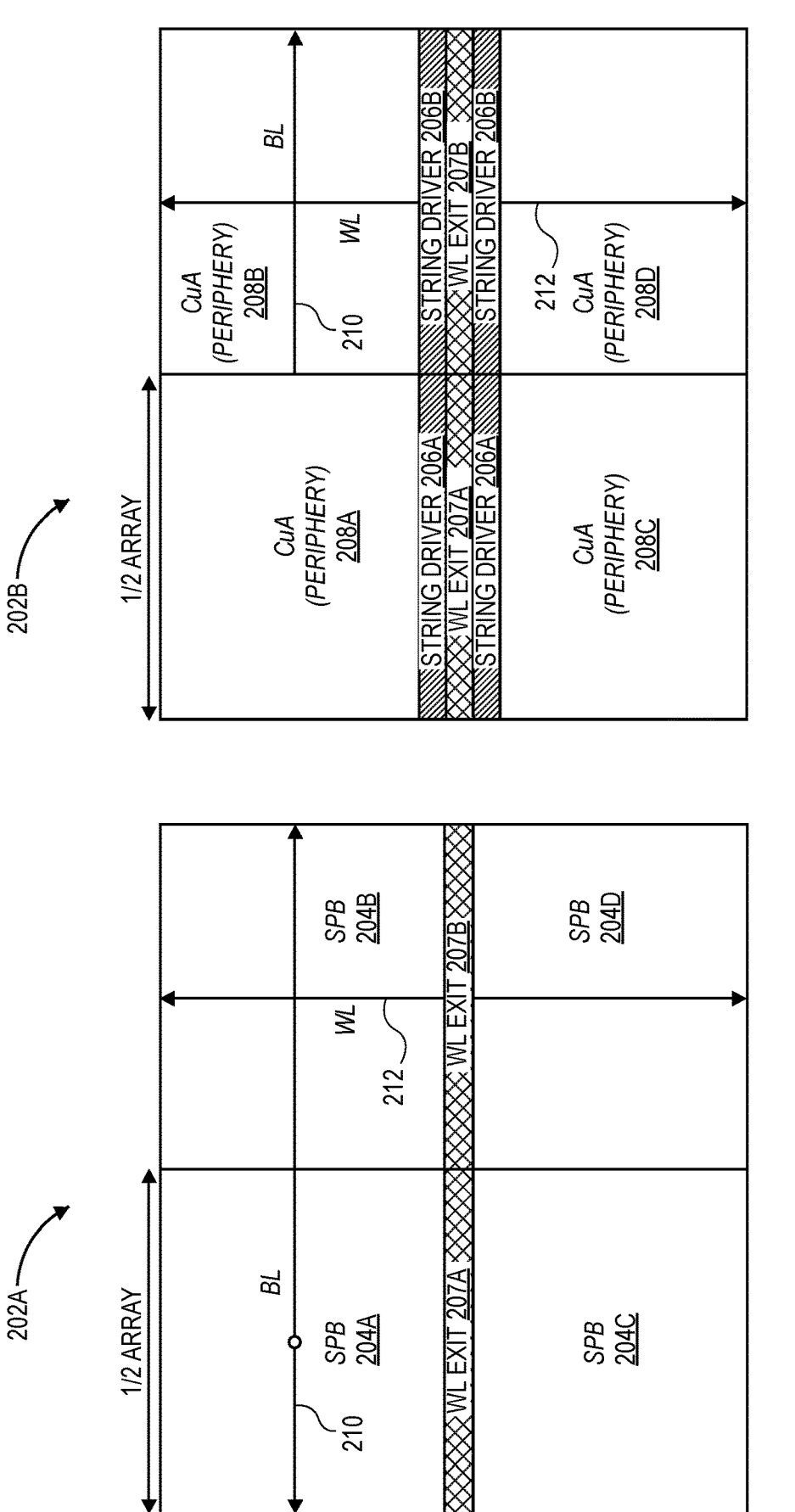
FIG. 2B illustrates a top down view of an example of two independent tile groups for CMOS circuitry divided between two wafers.

FIG. 2B illustrates a top down view of an example of two independent tile groups for CMOS circuitry under and over the array. In one example, a die plan would include multiple tile groups and a pad region. FIG. 2B illustrates plans for two dies 202A and 202B. The die 202A is one of many dies processed on a first wafer and the die 202B is one of many dies processed on a second wafer. In the example of FIG. 2B, the page buffers 204A-204D of die 202A are processed on the array wafer and the string drivers 206A and 206B and remaining periphery circuits 208A-208D of die 202B are processed on a second wafer. In the illustrated example, both wafers include wordline exits 207A and 207B (e.g., areas to enable wordline access). In one example, the wafer with the page buffers is the same wafer the array is processed on, and the wafer with the string drivers is a CMOS only wafer. In another example, the wafer with the page buffers is a CMOS only wafer and the wafer with the string drivers is an array wafer. In one example, particular types of CMOS circuitry may be formed on one of the wafers, and not the other. For example, one of the wafers may include the page buffers, but not the string drivers, and another wafer may include the string drivers. In one such example, the CMOS-only wafer includes string drivers and does not include page buffers, and the CMOS and array wafer includes page buffers and does not include string drivers.

In one example, the static page buffers 204A-204D drive the bitlines 210 and the string drivers 206A and 206B drive the wordline 212. Page buffers enable reading from the array via the bitlines 210. In one example, each page buffer enables reading a plane in parallel. Therefore, adding page buffers typically increases the number of planes that can be read in parallel, which can increase performance. The remaining peripheral circuitry 208A-208B may include, for example, logic circuits, sense amplifiers, data path circuits, voltage regulators, charge pumps, and/or other control circuitry. In the example of FIG. 2B, the remaining periphery circuits 208A-208D occupy the majority of the second die 202B. In one example, having twice the area for periphery circuits allows fitting all of the required circuits in a die with half the array density, thus doubling the program throughput per terabyte. Having twice the area for the remaining periphery circuits 208A-208D can enable all of the CMOS circuitry to fit under or over the array (e.g., enabling no CMOS circuitry next to the array).

Consider an example in which the control circuitry of the die 202A is under the array and the control circuitry of die 202B is over the array. In the example of FIG. 2B, the entire area of the die 202A is occupied primarily by page buffers 204A-204D. Thus, twice as many static page buffers (SPBs) can be formed for a given product die density compared to conventional CuA components because the majority of the area (instead of less than half in conventional components) under the array is available to place the page buffers. Dedicating all or substantially all of the area under the array to page buffer circuitry can significantly increase product performance by increasing the number of NAND planes that can be accessed concurrently. Unlike the example of FIG. 1B in which the control circuitry includes two page buffers, in the example illustrated in FIG. 2B, the control circuitry includes four page buffers to enable four planes to be accessed in parallel. In addition, since the string drivers are placed on top of array, the routing complexities to connect the array wordlines to the string drivers are greatly reduced as they do not have to go through thick array stack. This also provides additional die size reduction as the area occupied by the routing at the wordline exit region can be substantially reduced.

Thus, in the illustrated example, the control circuitry for accessing an array formed on one die is split between the array die and a CMOS only die. In one example, first CMOS control circuitry on the same die as the 3D NAND array includes page buffers and the second CMOS control circuitry includes string drivers on a second die that is stacked and bonded with the first die via wafer-to-wafer bonding. In one such example, the majority of the area of the first die includes page buffer circuitry and the second CMOS circuitry of the second die includes string drivers over the 3D NAND array. In one example, the second CMOS control circuitry of the second die is over the 3D NAND array of the first die and the first CMOS control circuitry of the first die is under the 3D NAND array of the first die. Alternatively, the second CMOS control circuitry of the second die may be under the 3D NAND array of the first die and the first CMOS control circuitry of the first die is over the 3D NAND array of the first die.

Although the example of FIG. 2B shows the page buffer circuitry all on one wafer and the string drivers on the other wafer, other implementations are possible. For example, the page buffers may be split across multiple wafers, the string drivers may be split across multiple wafers, and/or the remaining periphery circuitry may be split across multiple wafers.

Figure 3:
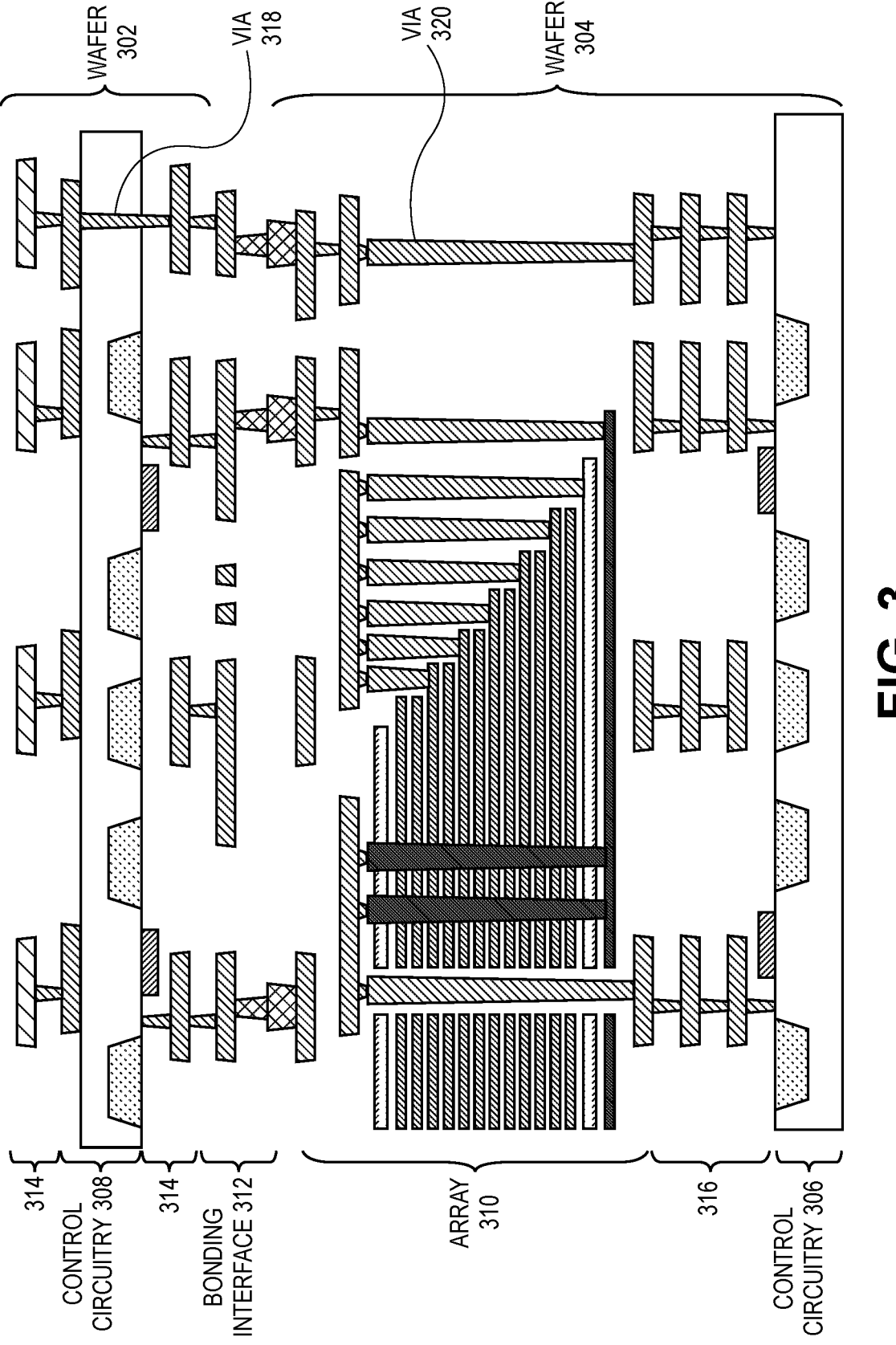
FIG. 3 is an example of a 3D NAND component with control circuitry on two wafers.

FIG. 3 is an example of a 3D NAND component with control circuitry on two wafers. The 3D NAND component of FIG. 3 is formed from two wafers 302 and 304. In the illustrated example, the wafer 302 is a CMOS-only wafer (e.g., a wafer without an array). Thus, the wafer 302 includes control circuitry 308 and conductive interconnect (e.g., metal interconnects) 314. The wafer 304 includes an array 310, control circuitry 306, and conductive interconnects 316. The wafer 302 is bonded on the backside of the wafer 304 at a bonding interface 312. One or more vias (e.g., via 318) of the top wafer 302 is connected to one or more vias (e.g., via 320) of the bottom wafer 304. This connection is established during the bonding process combining the two wafers.

Figure 4:
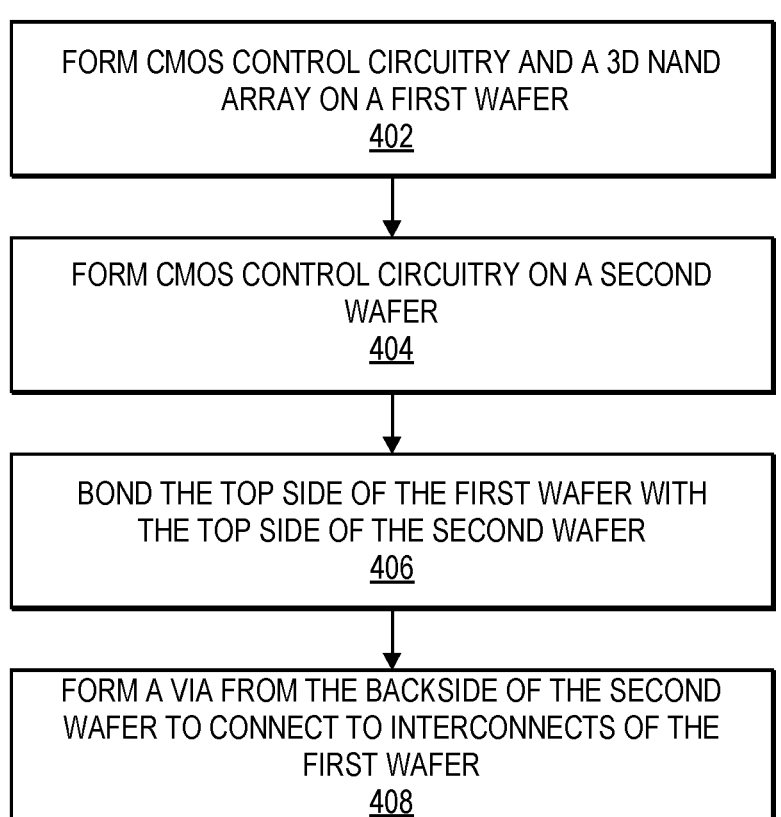
FIG. 4 is a flow diagram of an example of a method of forming a 3D NAND component.

FIG. 4 is a flow diagram of an example of a method of forming a 3D NAND component. The method 400 of FIG. 4 may be used to form 3D NAND components such as the components illustrated in FIGS. 2A, 2B, and 3.

The method 400 begins with forming CMOS control circuitry and a 3D NAND array on a first wafer, at 402. The method 400 also begins with forming CMOS control circuitry on a second wafer, at 404. In one example, the second wafer is a CMOS-only wafer without a 3D NAND array. Forming the arrays and CMOS circuitry involves multiple processing steps, including the deposition, doping, and etching of various materials to form the arrays and control circuitry.

After formation of the array and CMOS circuitry on the first wafer and the CMOS circuitry on the second wafer, the wafers are bonded "face-to-face" or top-side to top-side, at 406. In one example, the CMOS-only wafer is flipped up-side-down to enable the top side of the CMOS-only wafer to be bonded with the top side of the array and CMOS wafer. In another example, the wafer with both the array and CMOS can be flipped up-side down and bonded with the top of the CMOS-only wafer. Bonding the wafers together involves wafer-to-wafer bonding techniques to either bond together bonding pads that are attached to the wafers or to bond the wafers together at conductive contacts of the wafers. In one example, wafer-to-wafer bonding with sub-micron alignment accuracy may be achieved using the following process flow. First the wafers are cleaned and the surfaces are activated (by surface treatment) to enhance the bonding. This is followed by the wafers being aligned using face to face (F2F) precision optical alignment, which enables sub-μm alignment precision. Once aligned, wafers are bonded by thermal-compression in a regular cleanroom atmosphere. Optimized tooling and process sequences can ensure that sub-μm alignment precision is maintained across the entire wafer.

In some examples, the bonding between the logic circuitry and a memory array may be formed using fusion bonding or hybrid bonding. In fusion bonding (which is also referred to as direct bonding), no conductive structure (e.g., vias including metal) extends through the first and second layers, while these layers are being bonded to form the bonding interface layer. After the bonding is completed, via holes are formed extending through the bonding interface layer and are filled with metal, thereby forming interconnect structures between the logic circuitry and the memory array through the bonding interface layer. Because the vias are formed through the bonding interface layer subsequent to the first and second layers being bonded, sections of an interconnect structure extending through the bonding interface layer do not have any misalignment or offset (no unlanded portions).

Another wafer-to-wafer technique is hybrid bonding. In hybrid bonding, the bonding process is between the faces of the wafers and also between conductive structures of the wafers. For example, in hybrid bonding, the surfaces of the wafers and exposed conductive structures (e.g., vias including metal) are bonded together to form a bonding interface layer. Other wafer-to-wafer bonding techniques may also be used.

After bonding the wafers, the backside of the top wafer may be thinned or polished to reduce the thickness of the wafer. A through silicon via (TSV) may then be formed from the backside of the second wafer to connect to interconnects of the first wafers, at 408. An additional metallization process may also be used to form additional interconnects to connect with the interconnects of both wafers. The wafers may then be diced to form individual 3D NAND components.

Figure 5A:
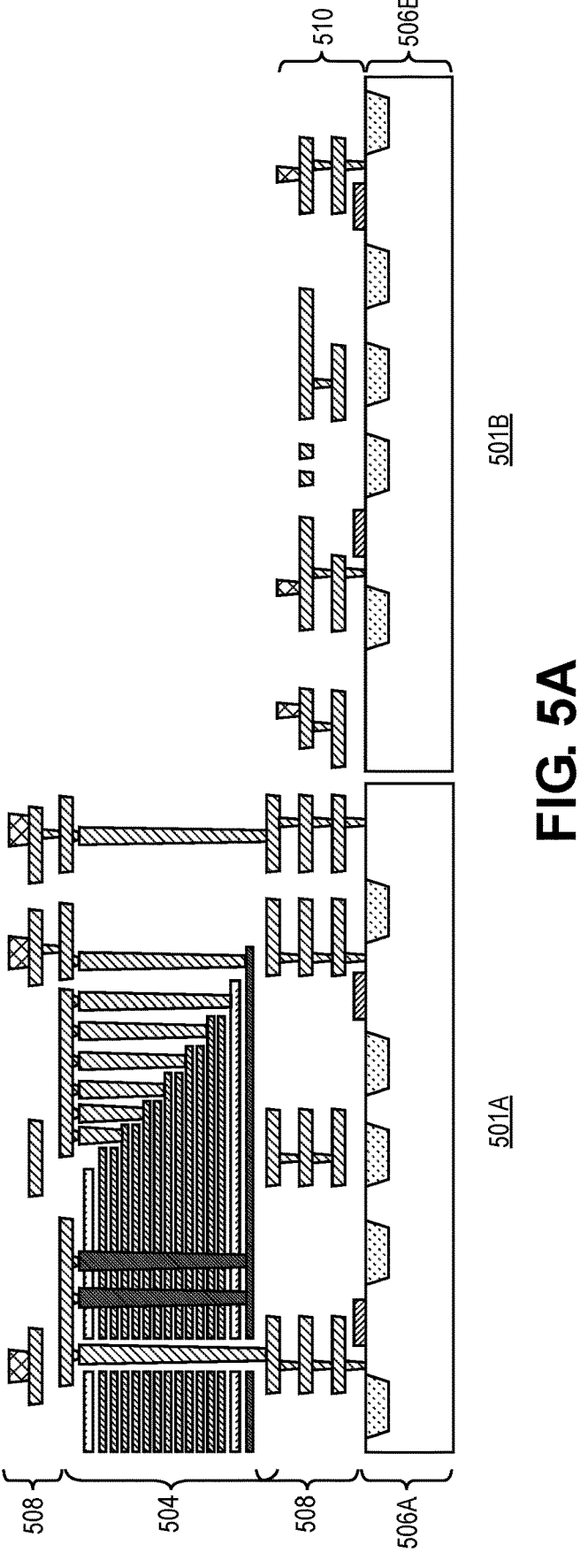
FIGS. 5A-5D show cross sections of a 3D NAND component in various stages of processing, in accordance with an example method such as the method of FIG. 4.

FIGS. 5A-5D show cross sections of a 3D NAND component in various stages of processing, in accordance with an example method such as the method 400 of FIG. 4. FIG. 5A shows a portion of a first wafer 501A and a portion of a second wafer 501B. A 3D NAND array 504, control circuitry 506A, and interconnects 508 are formed on or in the first wafer 501A. Control circuitry 506B and interconnects 510 are formed on or in the second wafer 501B.

Figure 5B:
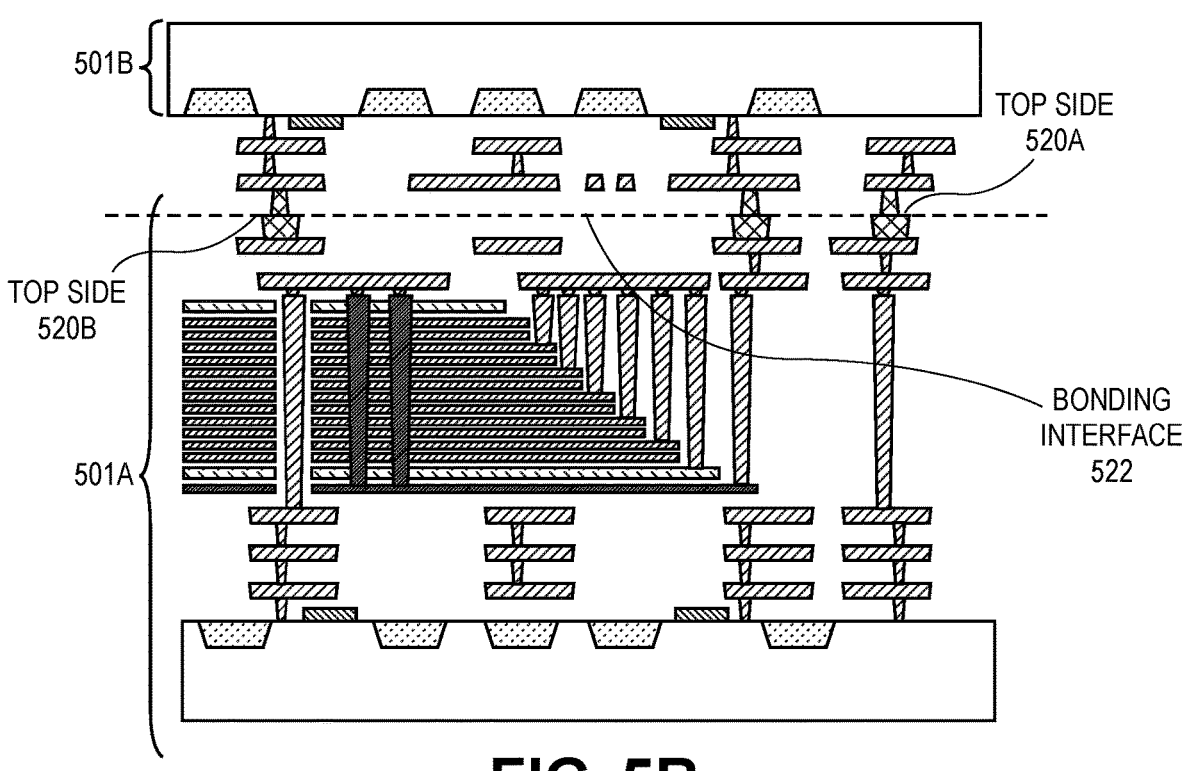
Figure 5C:
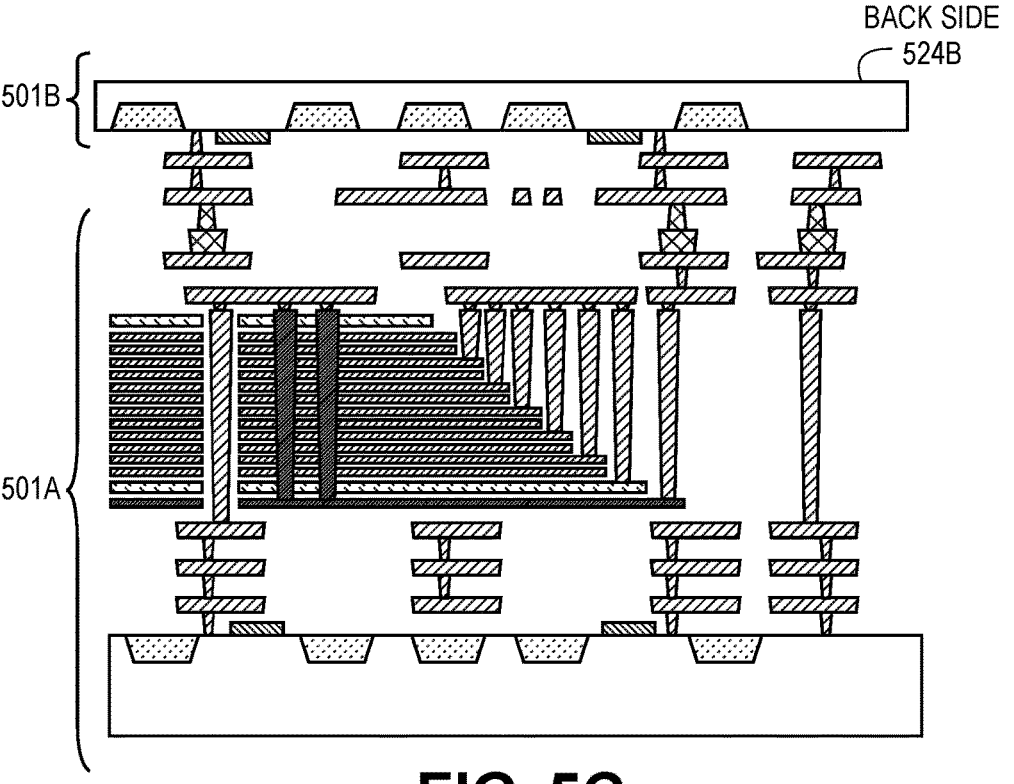
Figure 5D:
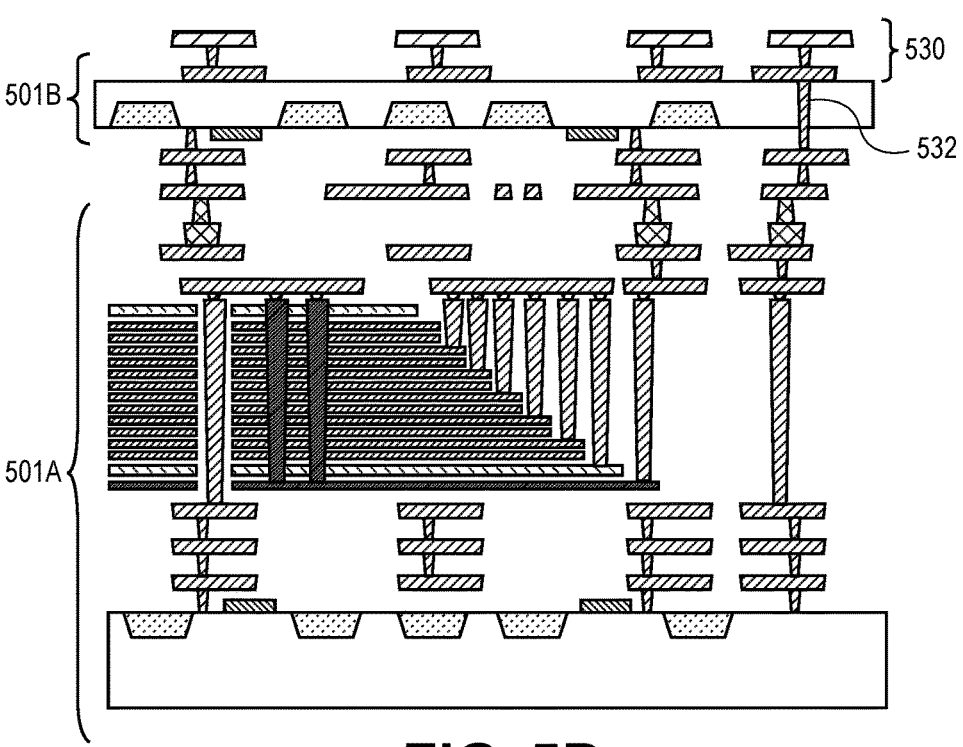

FIG. 5B shows the wafer 501A and 501B bonded together via a wafer-to-wafer bonding process at a bonding interface 522. In the illustrated example, the wafer 501B is flipped up-side down so that a top or front side 520B of the wafer 501B is bonded with a top or front side 520A of the wafer 501A. FIG. 5C illustrates the bonded wafers after thinning the backside 524B of the wafer 501B. FIG. 5D illustrates the bonded wafers after an additional metallization process to connect interconnects of the wafers 501A and 501B. For example, additional conductive interconnects 530 and a conductive via 532 are formed to enable connecting the control circuitry of wafer 501B to the array and to connect the array and connect the control circuitry of both wafers to the package of the 3D NAND component.

Figure 6:
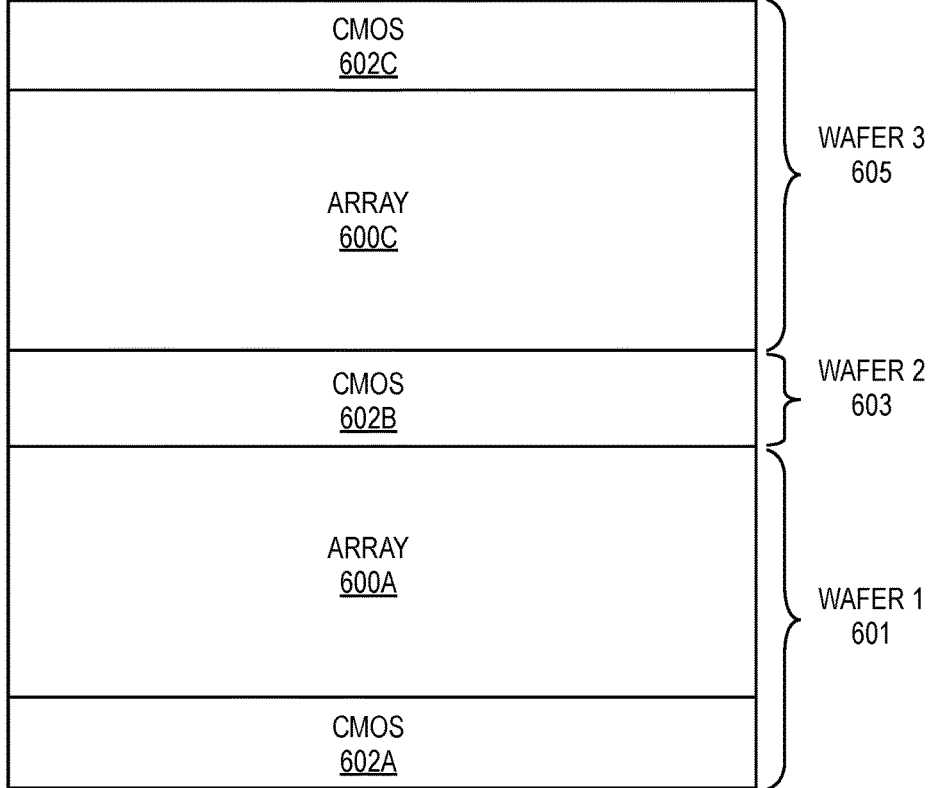
FIG. 6 is a block diagram of an example of a 3D NAND component with three dies.

Although most of the examples above refer to only one wafer with an array and CMOS control circuitry and a second wafer with CMOS control circuitry, but no array, the techniques described herein may be expanded to more than two wafers. For example, FIG. 6 is a block diagram of an example of a 3D NAND component formed from three wafers. Like in FIG. 2A, a CMOS wafer 603 is stacked and bonded over a CMOS and array wafer 601, where the CMOS wafer 603 includes CMOS circuitry 602A and the CMOS and array wafer 601 includes a 3D NAND array 600A and CMOS circuitry 602B. However, unlike the example in FIG. 2A, a third wafer 605 that includes both CMOS circuitry 602C and an array 600C is stacked and bonded over the CMOS and array wafer 601. In one such example, the CMOS circuitry 602B is between the two arrays 600A and 600C. In one example, the CMOS circuitry 602B includes control circuitry for both the array 600A and the array 600C. Thus, in the techniques described herein can be expanded to more than two stacked and bonded wafers. In the example in FIG. 6, the 3D NAND component is formed from three stacked and bonded wafers, including a CMOS-only wafer between two CMOS and array wafers.

Figure 7:
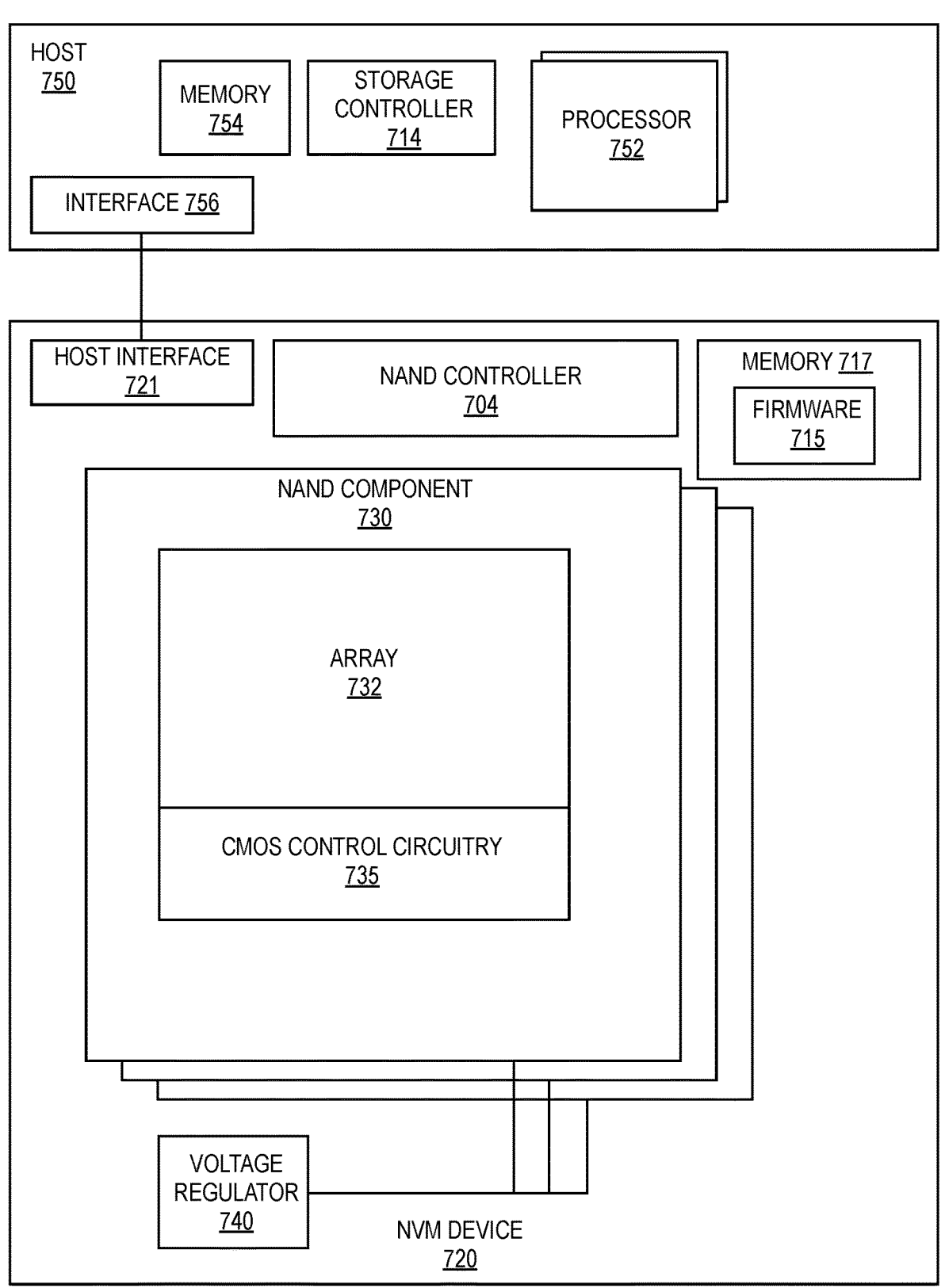
FIG. 7 is a block diagram of an example system that includes a NAND device.

FIG. 7 is a block diagram of an example system that includes a NAND device.

The system 700 includes a host 750 and non-volatile storage device or non-volatile memory (NVM) device 720. The NVM device 720 may be a solid state drive (SSD) or other non-volatile memory device or drive. The host 750 and the NVM device 720 can be an example of a system that exists within the confines of a computer's package (e.g., within a laptop/notebook, server, or other computer). In other examples, the NVM 720 may be accessed via a larger network such as a local area network (e.g., an Ethernet network), or a wide area network (such as a wireless cellular network, the Internet, etc.). Such examples may be in compliance with a standard such as NVMe-oF (non-volatile memory express over fabrics). The host 750 includes one or more processors 752, memory 754, a storage controller 714, and other components that are omitted from the drawing for clarity.

The NVM device 720 includes one or more NAND components 730. Each NAND component includes one or more memory arrays 732 for storing data. The arrays 732 can be a memory or storage medium that can store one or more bits in memory cells. In one example, the arrays include strings of memory cells such as the NAND strings illustrated in FIG. 8, discussed below. In one example, the NVM device 720 includes one or more non-volatile memory dies, each divided into multiple planes or groups. NAND flash memory is typically block-addressable. Typical NAND array dies have multiple planes per die. A plane includes multiple memory cells which may be grouped into blocks. A block is typically the smallest erasable entity in a NAND flash die. In one example, a block includes a number of cells that are coupled to the same bitline. A block includes one or multiple pages of cells. The size of the page can vary depending on implementation. In one example, a page has a size of 16 kB. Page sizes of less or more than 16 kB are also possible (e.g., 512B, 2 kB, 4 kB, etc.). In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Tri-Level Cell ("TLC"), Quad-Level Cell ("QLC"), Penta-Level Cell (PLC) or some other NAND).

According to some examples, volatile types of memory included in the NVM device 720 can include, but are not limited to, random-access memory (RAM), Dynamic RAM (D-RAM), double data rate synchronous dynamic RAM (DDR SDRAM), static random-access memory (SRAM), thyristor RAM (T-RAM) or zero-capacitor RAM (Z-RAM). Volatile types of memory may be compatible with a number of memory technologies, such as DDR4 (DDR version 4, initial specification published in September 2012 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (LPDDR version 5, currently in discussion by JEDEC), HBM2 (HBM version 2, currently in discussion by JEDEC), and/or others, and technologies based on derivatives or extensions of such specifications.

The NVM device 720 communicates with the host system 750 using respective interfaces 721 and 756. In one example, the interface 756 is a part of a peripheral control hub (PCH). In the example illustrated in FIG. 7, the host includes a controller 714 that is coupled with the NVM device 720 via the interface 756 to communicate with and control the NVM device 720. In the illustrated example, the NVM device 720 includes a controller 704 that is coupled with a computing platform such as the host 750 via the interface 721. In one example, the controller 704 is an ASIC (application specific integrated circuit). In one example, the interfaces are compliant with a standard such as PCI Express (PCIe), serial advanced technology attachment (ATA), a parallel ATA, universal serial bus (USB), and/or other interface protocol. The controller 704 can communicate with elements of the computing platform to read data from the NAND components 730 or write data to the NAND components 730.

The controller 704 can be configured to receive requests from the host 750 and generate and perform commands concerning the access of the arrays 732 (e.g., to read data, write, or erase data). Other commands may include, for example, commands to read status, commands to change configuration settings, a reset command, etc. The controller includes control logic that can be implemented with hardware (e.g., circuitry), software, firmware, or a combination of hardware, software and firmware. Examples of logic circuitry include dedicated hardwired logic circuitry (including, e.g., one or more state machine logic circuits), programmable logic circuitry (e.g., field programmable gate array (FPGA), and a programmable logic array (PLA). In one example, logic circuitry is designed to execute some form of program code such as SSD firmware (e.g., an embedded processor, embedded controller, etc.). The NVM device 720 may include a memory 717 coupled with the controller 704 which can be used to cache data from the non-volatile media and store firmware 715 executed by the controller 704.

The controller 704 is coupled with the NAND components 730 to control or command circuitry on the dies to cause operations to occur (e.g., read, program, erase, suspend, resume, and other operations). Communication between the NAND components 730 and the controller 704 may include the writing to and/or reading from specific registers. Such registers may reside in the controller 704, on the NAND components 730, or external to the controller 704 and the NAND components 730. Registers or memory within the components 730 may be reachable by the controller 704 by, e.g., an internal interface between the controller 704 and NAND components 730 (e.g., an Open NAND Flash Interface (ONFI) interface, a proprietary interface, or other interface) to communicatively couple the controller 704 and the arrays 732. Input/output (I/O) pins and signal lines communicatively couple the controller 704 with the NAND components 730 to enable the transmission of read and write data between the controller 704 and the NAND components 730. The I/O pins may also be used to transmit other data, such as status information of the dies or planes of the NAND components 730. The NAND components can also include other pins such as command pins (e.g., command latch enable (CLE), address latch enable (ALE), chip enable (CE #), read enable (RE #), and write enable (WE #)), and power and ground pins (e.g., Vcc, Vss, etc.). The voltage regulator 740 represents circuitry to provide one or more voltages to the control circuitry 735, and/or array 732.

The NAND component 730 includes CMOS control circuitry 735 to control access to the array 732. For example, the control circuitry 735 is to generate or apply voltages to the array 732 to perform access operations (e.g., read operations, program operations, etc.) based on commands received from the controller 704. The control circuitry 735 on the NAND component 730 is coupled to word lines of array 732 to select one of the word lines, apply read voltages, apply program voltages combined with bit line potential levels, apply verify voltages, or apply erase voltages, and is also is coupled to bit lines of array 732 to read data stored in the memory cells, determine a state of the memory cells during a program operation, and control potential levels of the bit lines to promote or inhibit programming and erasing. The control circuitry 735 may be split or divided across multiple dies of the NAND component, as described herein.

Figure 8:
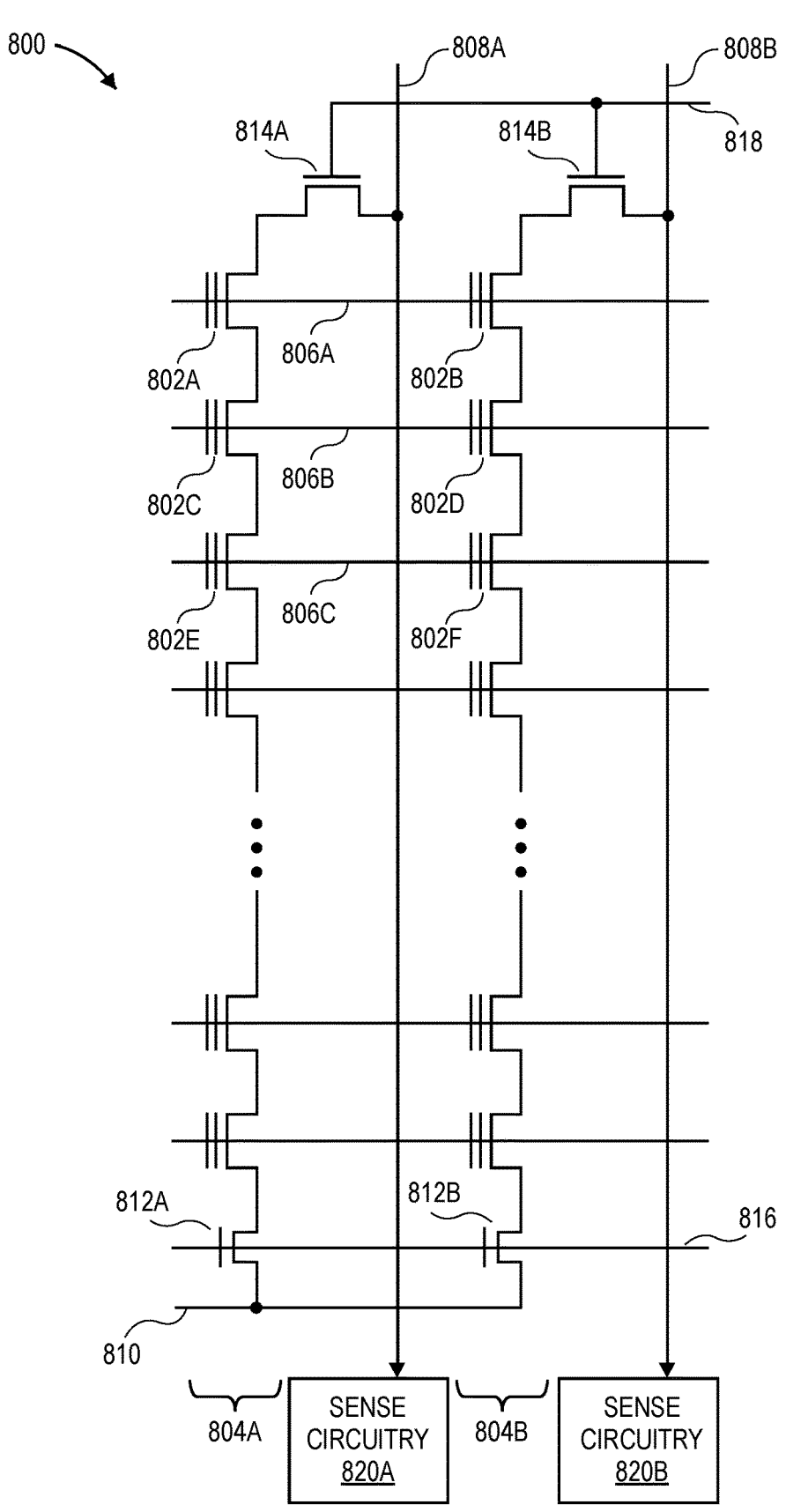
FIG. 8 depicts an example portion of a NAND flash memory array.

FIG. 8 depicts an example portion of a NAND flash memory array 800 of NAND memory cells. The NAND flash memory array 800 includes multiple non-volatile memory cells 802A-802F (abbreviated as 802) arranged in columns, such as series strings 804A and 804B (abbreviated as 804). In one example, the memory cell 802 includes a transistor with a replacement gate. A cell with a replacement gate typically has a low resistance gate (e.g., a tungsten gate)

and a charge trap layer between the gate and the channel where charge is trapped or stored to represent one or more bit values. In another example, a memory cell 802 can include a transistor with a floating gate (e.g., a high resistance poly gate) that stores charge indicative of one or more bit values. Other architectures are also possible. In the series strings 804, drain regions of cells 802 are (with the exception of the top cell) coupled to a source region of another cell 802.

The array 800 also includes wordlines 806A-806C. The wordlines 806A-806C can span across multiple series strings 804 (e.g., a wordline may be coupled to one memory cell of each series string 804) and are connected to the control gates of each memory cell 802 of a row of the array 800 and used to bias the control gates of the memory cells 802 in the row. The bitlines 808A and 808B (abbreviated as 808) are each coupled to a series string 804 by a drain select gate 814 and sensing circuitry 820A and 820B that detects the state of each cell by sensing voltage or current on a particular bitline 808. The sensing circuitry 820A and 820B can be implemented in the CMOS control circuitry discussed herein.

Multiple series strings 804 of the memory cells are coupled to a source line 810 by a source select gate or select-gate-source (SGS) 812A and 812B (abbreviated as 812) and to an individual bitline 808 by a drain select gate or select-gate-drain (SGD) 814A and 814B (abbreviated as 814). The source select gates 812 are controlled by a source select gate control line 816 and the drain select gates 814 are controlled by a drain select gate control line 818.

In some examples, each memory cell 802 can be programmed according to various encoding schemes such as SLC (single level cell), MLC (multi-level cell) TLC (triple level cell), QLC (quad level cell), or other encoding scheme. Each cell's threshold voltage (Vt) is indicative of the data that is stored in the cell. In one example, a cell state that is set to store multiple bits may form a part of multiple different pages, with each bit of the cell corresponding to a distinct page. For example, for a cell that is to enter a state to store 2 bits (e.g., using an MLC encoding scheme), one bit may correspond to an Upper Page (UP) and the other bit may correspond to a Lower Page (LP). For a cell that is to enter a state to store 3 bits (i.e., using a TLC encoding scheme), one bit may correspond to an LP, one bit may correspond to a UP, and the other bit may correspond to an Extra Page (XP). For a cell that is to store 4 bits (i.e., using a QLC encoding scheme), one bit may correspond to an LP, another bit may correspond to a UP, another bit may correspond to an XP, and the final bit may correspond to a Top Page (TP). Each page (e.g., LP, UP, XP, or TP) may include an aggregation of corresponding bits stored by a plurality of different cells of a wordline.

In the case of a read, particular voltages are applied to the wordlines 806A-806C as well as select gates. The respective charges stored in the cells that are coupled to the activated word line influence the potential on their respective columns (e.g., "channels") and bit lines which are then sensed with sense circuitry (e.g., the sense circuitry 820A or 820B) to determine the read information (the cells that are not coupled to the activated word line are electrically isolated from their respective columns).

Figure 9:
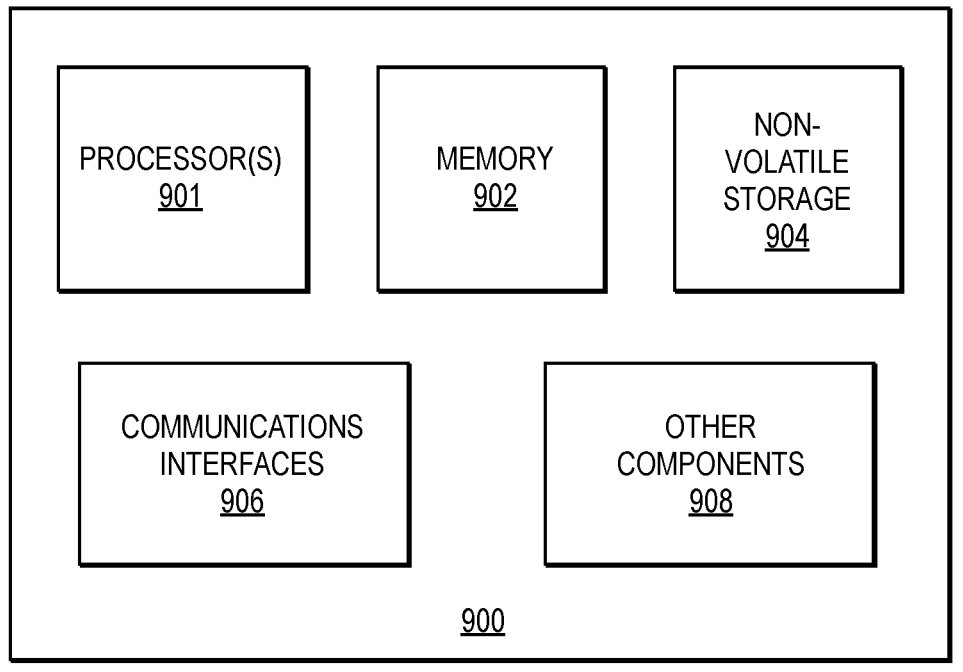
FIG. 9 provides an exemplary depiction of a computing system in which a NAND memory device can be included.

FIG. 9 provides an exemplary depiction of a computing system 900 (e.g., a smartphone, a tablet computer, a laptop computer, a desktop computer, a server computer, etc.). As observed in FIG. 9, the system 900 may include one or more processors or processing units 901. The processor(s) 901 may include one or more central processing units (CPUs), each of which may include, e.g., a plurality of general-purpose processing cores. The processor(s) 901 may also or alternatively include one or more graphics processing units (GPUs) or other processing units. The processor(s) 901 may include memory management logic (e.g., a memory controller) and I/O control logic. The processor(s) 901 can be similar to, or the same as, the processor 752 of FIG. 7.

The system 900 also includes memory 902 (e.g., system memory), non-volatile storage 904, communications interfaces 906, and other components 908, which may also be similar to, or the same as, components of the host 750 of FIG. 7. The other components may include, for example, a display (e.g., touchscreen, flat-panel), a power supply (e.g., a battery or/and other power supply), sensors, power management logic, or other components. The communications interfaces 906 may include logic and/or features to support a communication interface. For these examples, communications interface 906 may include one or more communication interfaces that operate according to various communication protocols or standards to communicate over direct or network communication links or channels, such as a network interface. Direct communications may occur via use of communication protocols or standards described in one or more industry standards (including progenies and variants) such as those associated with the PCIe specification. Network communications may occur via use of communication protocols or standards such those described in one or more standards promulgated by IEEE. For example, one such Ethernet standard may include IEEE 802.3. Network communication may also occur according to one or more OpenFlow specifications such as the OpenFlow Switch Specification. Other examples of communications interfaces includes, for example, a local wired point-to-point link (e.g., USB) interface, a wireless local area network (e.g., WiFi) interface, a wireless point-to-point link (e.g., Bluetooth) interface, a Global Positioning System interface, and/or other interfaces.

The computing system also includes non-volatile storage 904, which may be the mass storage component of the system. The non-volatile storage 904 can be similar to, or the same as, the NVM device 720 of FIG. 7, described above. The non-volatile storage 904 can include a solid state drive (SSD), a dual in-line memory module (DIMM), or other non-volatile storage. Non-volatile types of memory may include non-volatile memory such as, but not limited to, multi-threshold level NAND flash memory (e.g., 3D NAND flash memory), and NOR flash memory. In one example, the non-volatile storage 904 may include mass storage that is composed of one or more SSDs. SSDs can be composed of flash memory chips that are capable of implementing the array access sequences described above.

Thus, a high performance, high density memory can be achieved by bonding a CMOS-only wafer to the wafer with the array and CMOS, doubling the amount of CMOS available and enabling twice the I/O performance. Examples of three-dimensional (3D) NAND components with control circuitry across multiple wafers follow:

Example 1: A non-volatile storage component including a first die including a three-dimensional (3D) NAND array and first complementary metal oxide semiconductor (CMOS) control circuitry to access the 3D NAND array, and a second die vertically stacked and bonded with the first die, the second die including second CMOS control circuitry to access the 3D NAND array of the first die.

Example 2: The non-volatile storage component of example 1, wherein the first CMOS control circuitry includes page buffers on the first die with the 3D NAND array, and the second CMOS control circuitry includes string drivers on the second die.

Example 3: The non-volatile storage component of examples 1 or 2, wherein a majority of the area of the first die includes page buffer circuitry.

Example 4: The non-volatile storage component of any of examples 1-3, wherein the 3D NAND array is between the first CMOS control circuitry of the first die and the second CMOS control circuitry of the second die.

Example 5: The non-volatile storage component of any of examples 1-4, wherein the second CMOS circuitry of the second die includes string drivers over the 3D NAND array.

Example 6: The non-volatile storage component of any of examples 1-5, wherein the second CMOS control circuitry of the second die is over the 3D NAND array of the first die, and the first CMOS control circuitry of the first die is under the 3D NAND array of the first die.

Example 7: The non-volatile storage component of any of examples 1-6, wherein the second CMOS control circuitry of the second die is under the 3D NAND array of the first die, and the first CMOS control circuitry of the first die is over the 3D NAND array of the first die.

Example 8: The non-volatile storage component of any of examples 1-7, further including a third die vertically stacked and bonded with the second die, the third die including a second three-dimensional (3D) NAND array and third complementary metal oxide semiconductor (CMOS) control circuitry to access the second 3D NAND array.

Example 9: The non-volatile storage component of any of examples 1-8, wherein the second CMOS circuitry of the second die is between the 3D NAND array of the first die and the second 3D NAND array of the third die.

Example 10. A system including: a processor, and a non-volatile storage device coupled with the processor, the non-volatile storage device including a first die including a three-dimensional (3D) NAND array and first complementary metal oxide semiconductor (CMOS) control circuitry to access the 3D NAND array, and a second die vertically stacked and bonded with the first die, the second die including second CMOS control circuitry to access the 3D NAND array of the first die.

Example 11: The system of example 10, wherein the non-volatile storage device is in accordance with any of examples 2-9.

Example 12: The system of examples 10 or 11, further including one or more of a display coupled with the processor, a network interface coupled with the processor, and a battery to power the system.

Example 13: A three-dimensional (3D) NAND memory component including: a first die comprising a three-dimensional (3D) array of NAND memory cells and first complementary metal oxide semiconductor (CMOS) control circuitry to access the 3D array of NAND memory cells, and a second die vertically stacked and bonded with the first die, the second die including second CMOS control circuitry to access the 3D array of NAND memory cells of the first die.

Example 14: the 3D NAND memory component of example 13, wherein the component is in accordance with any of examples 2-9.

Embodiments of the invention may include various processes as set forth above. The processes may be embodied in machine-executable instructions. The instructions can be used to cause a general-purpose or special-purpose processor to perform certain processes. Alternatively, these processes may be performed by specific/custom hardware components that contain hardwired logic circuitry or programmable logic circuitry (e.g., FPGA, PLD) for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

Flow diagrams as illustrated herein provide examples of sequences of various process actions. The flow diagrams can indicate operations to be executed by a software or firmware routine, as well as physical operations. In one example, a flow diagram can illustrate the state of a finite state machine (FSM), which can be implemented in hardware, software, or a combination. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various examples; thus, not all actions are required in every embodiment. Other process flows are possible.

To the extent various operations or functions are described herein, they can be described or defined as software code, instructions, configuration, data, or a combination. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters or sending signals, or both, to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

As discussed herein, terms referencing direction, such as upward, downward, vertical, horizontal, left, right, front, back, top, bottom etc., are used for convenience to describe embodiments of integrated circuits having a base or substrate extending in a horizontal plane. Embodiments of the present disclosure are not limited by these directional references and it is contemplated that integrated circuits and device structures in accordance with the present disclosure can be used in any orientation.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A non-volatile storage component, comprising:
a stack of dies including:
   a first die including a first three-dimensional (3D) NAND array and first complementary metal oxide semiconductor (CMOS) control circuitry to access the first 3D NAND array; and
   a second die vertically stacked on, and bonded with, the first die, wherein the second die is a CMOS control circuitry die lacking a further 3D NAND array, and wherein the second die includes second CMOS control circuitry to access the first 3D NAND array of the first die, wherein the second CMOS control circuitry includes a plurality of wordline exits of a plurality of array wordlines and a plurality of string drivers disposed immediately adjacent to the plurality of wordline exits.

2. The non-volatile storage component of claim 1, wherein the first CMOS control circuitry includes page buffers on the first die with the first 3D NAND array.

3. The non-volatile storage component of claim 1, wherein a majority of an area of the first die includes page buffer circuitry.

4. The non-volatile storage component of claim 1, wherein:
   the first 3D NAND array is between the first CMOS control circuitry of the first die and the second CMOS control circuitry of the second die.

5. The non-volatile storage component of claim 1, wherein:
   the second CMOS control circuitry of the second die is over the first 3D NAND array of the first die; and
   the first CMOS control circuitry of the first die is under the first 3D NAND array of the first die.

6. The non-volatile storage component of claim 1, wherein:
   the second CMOS control circuitry of the second die is under the first 3D NAND array of the first die; and
   the first CMOS control circuitry of the first die is over the first 3D NAND array of the first die.

7. The non-volatile storage component of claim 1, wherein the first 3D NAND array is located physically between the first CMOS control circuitry of the first die and the second CMOS control circuitry of the second die.

8. The non-volatile storage component of claim 1, wherein the plurality of string drivers are placed on top of the 3D NAND array in the stack of dies, and configured to drive the plurality of array wordlines of the 3D NAND array.

9. A three-dimensional (3D) NAND memory component comprising:
   a first die comprising a first three-dimensional (3D) NAND array of memory cells and first complementary metal oxide semiconductor (CMOS) control circuitry;
   a second die vertically stacked on, and bonded with, the first die, the second die including second CMOS control circuitry,
   wherein array control circuitry to access the first 3D NAND array is disposed on both the first die and the second die, and a location of the NAND memory cells is limited to the first die;
   wherein the second CMOS control circuitry includes a plurality of wordline exits of a plurality of array wordlines and a plurality of string drivers disposed immediately adjacent to the plurality of wordline exits.

10. The 3D NAND memory component of claim 9, wherein:
   the first CMOS control circuitry includes page buffers on the first die with the first 3D NAND array.

11. The 3D NAND memory component of claim 9, wherein a majority of an area of the first die includes page buffer circuitry.

12. The 3D NAND memory component of claim 9, wherein:
   the first 3D NAND array is between the first CMOS control circuitry of the first die and the second CMOS control circuitry of the second die.

13. The 3D NAND memory component of claim 9, further comprising:
   a third die vertically stacked on, and bonded with, the second die, wherein the third die includes a second 3D NAND array and third CMOS control circuitry to access the second 3D NAND array;
   wherein the second CMOS control circuitry of the second die is configured to access both the first 3D NAND array of the first die and the second 3D NAND array of the third die.

14. The 3D NAND memory component of claim 13, wherein the first CMOS control circuitry includes first page buffer circuitry for the first 3D NAND array, and the third CMOS control circuitry includes second page buffer circuitry for the second 3D NAND array, and wherein the plurality of string drivers of the second CMOS control circuitry are configured to drive both the first 3D NAND array and the second 3D NAND array.

15. The 3D NAND memory component of claim 13, wherein the second die is physically disposed between the first die and the third die.

* * * * *